(12) United States Patent
Halderman et al.

(10) Patent No.: US 6,709,963 B1
(45) Date of Patent: Mar. 23, 2004

(54) METHOD AND APPARATUS FOR JET PRINTING A FLUX PATTERN SELECTIVELY ON FLIP-CHIP BUMPS

(75) Inventors: Jonathan D. Halderman, San Jose, CA (US); Raj N. Master, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 1 day.

(21) Appl. No.: 09/617,104

(22) Filed: Jul. 14, 2000

(51) Int. Cl.[7] .......................... H01L 21/44; B23Q 23/30
(52) U.S. Cl. ........................................ 438/612; 228/102
(58) Field of Search ............................ 438/106, 612; 148/23; 228/102; 347/45, 46; 118/723

(56) References Cited

U.S. PATENT DOCUMENTS 5,164,022 A * 11/1992 Pine et al.
6,098,867 A * 8/2000 Master et al.
6,114,187 A * 9/2000 Hayes
6,435,396 B1 * 8/2002 Eldridge ..................... 228/33

* cited by examiner

Primary Examiner—W. David Coleman

(57) ABSTRACT

A method and an apparatus are provided for selectively depositing flux on a plurality of flip-chip bumps arranged on a semiconductor chip by jet printing a flux pattern, which is substantially identical to the arrangement pattern of the flip-chip bumps. The flux pattern is determined by measuring the chip configuration and converting the configuration to computer-recognizable data. The converted chip configuration is stored in data storage, and a jet printing head prints the flux pattern based on the computer-recognizable data. A conveyance plate is provided to transport the semiconductor chip to a flux-deposition area below the jet printing head.

6 Claims, 4 Drawing Sheets

METHOD AND APPARATUS FOR JET PRINTING A FLUX PATTERN SELECTIVELY ON FLIP-CHIP BUMPS

FIELD OF THE INVENTION

The present invention relates to semiconductor assembly technology, and more particularly to flip-chip interconnections between a semiconductor chip and a substrate.

BACKGROUND OF THE INVENTION

A common task in the manufacture of microelectronic components involves the manufacture of single chip or multi-chip modules having input/output pins which are inserted into a substrate. The input/output pins provide the needed electrical connections to the integrated circuit chip or chips which are subsequently connected to the substrate or carrier. In other presently known manufacturing processes, a chip is soldered directly to a printed circuit board. With either process, solder flux compositions have typically been applied to the pins in order to connect the component to the selected substrate, for instance, the printed circuit board.

As electronic devices become smaller and denser, greater demands are placed on the ability to establish efficient, reliable interconnections from a semiconductor chip to a substrate. There are three well-known methods for interconnecting chips to a substrate. The three methods are (a) face-up wire bonding, (b) face-up tape-automated bonding, and (c) the flip-chip method. Among these three methods, the flip-chip method has frequently been chosen as a preferred method of semiconductor packaging since it allows the interconnection of a high density device having a large number of input and output paths. Specifically, the flip-chip method is often preferred because it provides short conductivity leads from the chip to the substrate, a small device footprint, low inductance, high frequency capabilities, and good noise control.

As shown in FIG. 2, a flip-chip is a semiconductor chip 10 that is mounted onto a substrate 18 with the surface of the chip 10 facing the substrate 18. Although several materials may be used to form an interconnection between the flip-chip 10 and the substrate 18, solder is one of the more commonly employed materials for a flip-chip bump 12. In the solder interconnection process termed "controlled-collapse chip connection (C4)", the solder flip-chip bump 12 is deposited on a conductive terminal on the semiconductor chip 10. Then the semiconductor chip 10 is aligned with the substrate 18 so that the solder flip-chip bump 12 is directly over a flip-chip pad 20 of the substrate 18. The flip-chip bump 12 is then tacked to the substrate 18 and reflowed in the presence of flux, creating an electrical and mechanical connection from the chip 10 to the substrate 18 as well as a path for heat dissipation.

Typically, the chip-substrate joining process involves application of flux on the chip 10 and/or the flip-chip pads 20 of the substrate 18. As shown in FIG. 1, flux 16 is sprayed over the entire surface of the semiconductor chip 10 by a jet sprayer 14, including the previously formed flip-chip bumps 12. Then, the chip 10 is aligned to the substrate 18 having flip-chip pads 20 on its surface, which is further facilitated by the flux viscosity and tackiness. The chip-substrate assembly is then subjected to solder reflow in a furnace under nitrogen or forming gas. In the subsequent cooling cycle of the thermal profile for joining, the solder hardens and at the same time the residual flux vapors deposit on the various exposed surfaces. Under the high temperature solder reflow environment, the flux is mostly removed by thermal decomposition to volatile species. However, a small fraction of these thermally activated species undergoes cross-linking reactions, resulting in resinous/carbonaceous byproducts as residue 22 (FIG. 2) on the C4 connections and all of the other surfaces on the chip 10 and the substrate 18 that are exposed to the volatile species during the solder reflow professing. The flux residue 22 must be removed from all critical surfaces prior to further operation, otherwise it can lead to function failure during long term use due to stress corrosion during exposure to temperature and humidity conditions. Further need for removal of flux residue is dictated by the observation that if any residual film of flux residue remains on the substrate or device surface material, it cause detriment to the adhesion of C4 epoxy encapsulant or underfill which is required for enhanced C4 fatigue life and C4 reliability during production on-off cycles.

Therefore, there exists a need for improved and production worthy methodology which removes flux residue from all critical surfaces.

SUMMARY OF THE INVENTION

These and other needs are met by the present invention which provides a method for jet printing a flux pattern on a semiconductor chip to selectively deposit flux on the flip-chip bumps to reduce flux residue from all critical areas of a chip surface. The present invention also provides an apparatus for jet printing a flux pattern which selectively deposit flux on the flip-chip bumps to reduce flux residue from all critical areas of a chip surface.

The method in accordance with the present invention includes determining an arrangement pattern of a plurality of flip-chip bumps formed on a surface of a semiconductor chip. A flux pattern, which is substantially identical to the arrangement pattern of the plurality of flip-chip bumps, is jet printed on the surface of the semiconductor chip. In certain embodiment of the present invention, a semiconductor chip is transported to a predetermined location for jet printing the flux pattern on the chip surface.

The apparatus in accordance with the present invention comprises a support for locating a semiconductor chip, which has a plurality of flip-chip bumps arranged on its surface, at a predetermined location for depositing flux, and a jet printing head for printing a flux pattern, which is substantially identical to an arrangement pattern of the plurality of flip-chip bumps on the semiconductor chip. In certain embodiment of the present invention, the apparatus is further equipped with data storage storing an arrangement pattern of the flip-chip bumps.

Hence, flux is selectively deposited on the flip-chip bumps of the semiconductor chip. This has an advantage of reducing flux residue remaining on the surfaces of both chip and substrate, thereby reducing the risk of the device's functional failure during long term use due to stress corrosion caused by exposure to temperature and humidity, thus achieving enhanced C4 fatigue life and C4 reliability during production on-off cycles. This invention has an advantage of reducing wasted flux randomly sprayed or brushed all over the entire surface of the chip, thereby reducing manufacturing costs.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the invention is capable of other and different embodiments, and its several details are capable of modifications in various obvious respects, all without departing from the present invention. Accordingly, the drawings and description are to be regarded as illustrative in nature, and not as restrictive.

DETAILED DESCRIPTION OF THE EXEMPLARY EMBODIMENTS

The method and apparatus described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-section portions of a semiconductor chip or a substrate during fabrication are not drawn to scale, but instead are drawn to illustrate the feature of the present invention.

In accordance with certain embodiments of the present invention, methods are provided that substantially reduce flux residue on the surfaces of a semiconductor chip or a substrate. As part of the invention, it was recognized that flux is normally deposited over the entire surface by jet spraying or brushing flux in accordance with conventional flux deposition processes, which increases the risk of the device's functional failure and risks flip-chip interconnection device life and reliability. Thus, in accordance with the present invention, flux is selectively deposited on each flip-chip bump by jet printing a flux pattern on the semiconductor chip, which is identical to the arrangement pattern of the flip-chip bumps on the chip. Since flux is selectively deposited only on each flip-chip bump and no flux is deposited directly to the surfaces of the chip or the substrate, the flux residue problem is significantly reduced.

Figure 1:
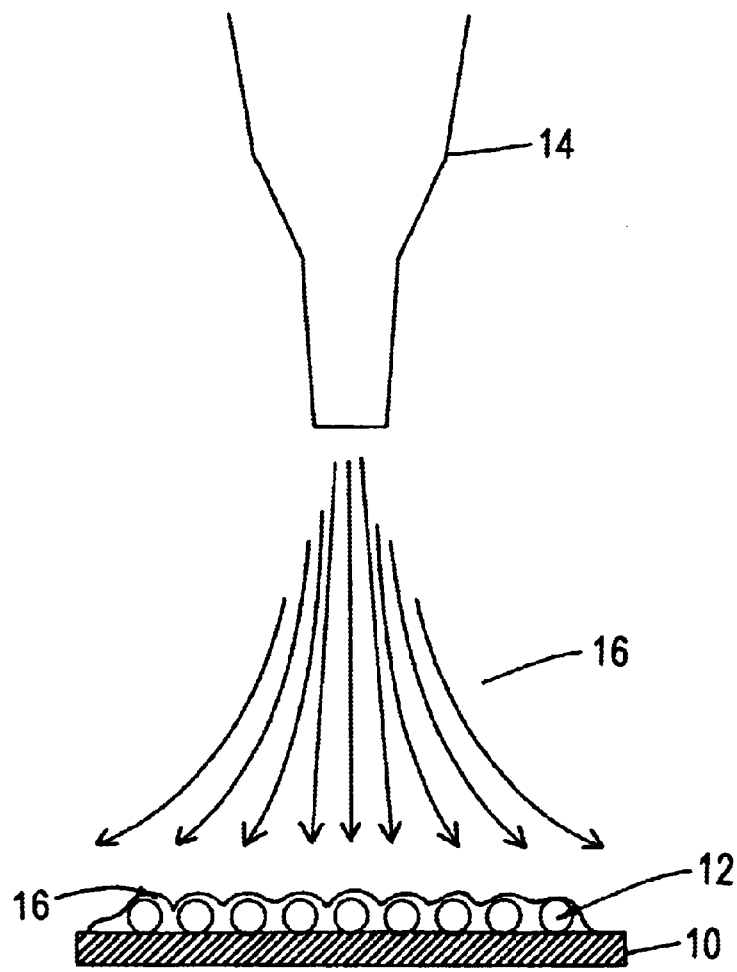
FIG. 1 depicts a prior art method of depositing flux on a semiconductor chip, in which flux is jet sprayed over the entire surface of the semiconductor chip.
Figure 2:
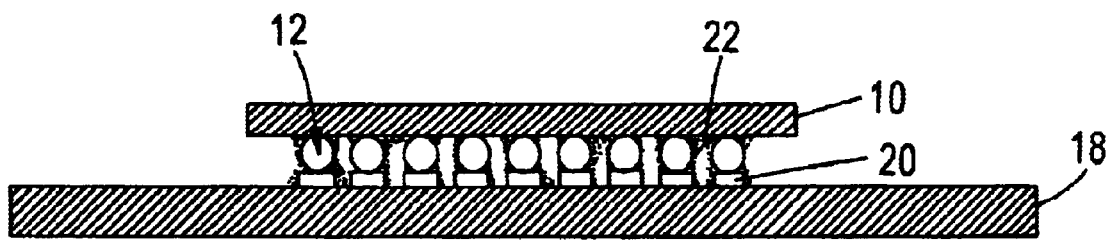
FIG. 2 depicts a cross-sectional view of a prior art flip-chip interconnection between a semiconductor chip and a substrate, in which flux residue remains on the surfaces of the chip and the substrate.
Figure 3:
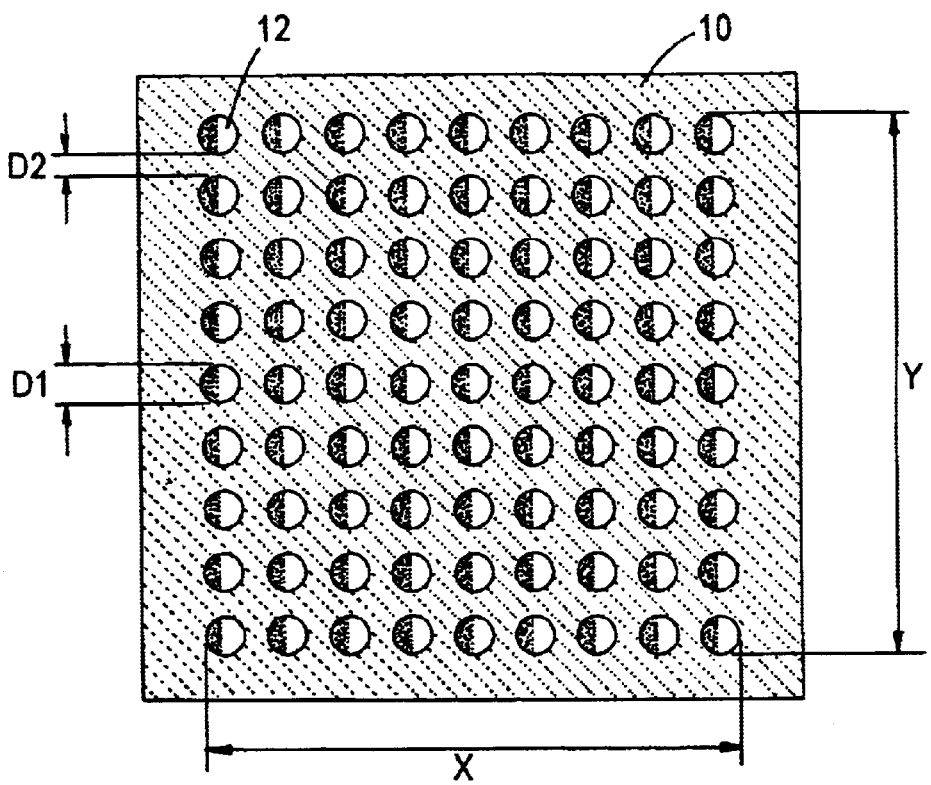
FIG. 3 depicts a top view of a semiconductor chip having a plurality of flip-chip bumps arranged on its surface.

With this in mind, FIG. 3 depicts a top view of a semiconductor chip 10 having a plurality of flip-chip bumps 12 arranged on its surface, in accordance with an exemplary embodiment of the present invention. The flip-chip bumps 12 are arranged in a matrix of 9 rows and 9 columns. In order to determine the precise arrangement pattern of the flip-chip bumps 12, it is necessary to determine the configuration of the flip-chip bumps 12, e.g., bump diameter D1, distance D2 between neighboring flip-chip bumps, length X from the first to the last flip-chip bumps 12 in each row, and length Y from the first to the last flip-chip bumps 12 in each column. The configuration of the flip-chip bumps 12 is easily acquirable from the design specification of the semiconductor chip 10. The determined configuration of the flip-chip bumps 12 are converted to computer-recognizable data format, e.g., binary data format, by a conventional computer system, and stored in data storage, e.g., a hard disk, for the subsequent step of jet printing a flux pattern.

Figure 4:
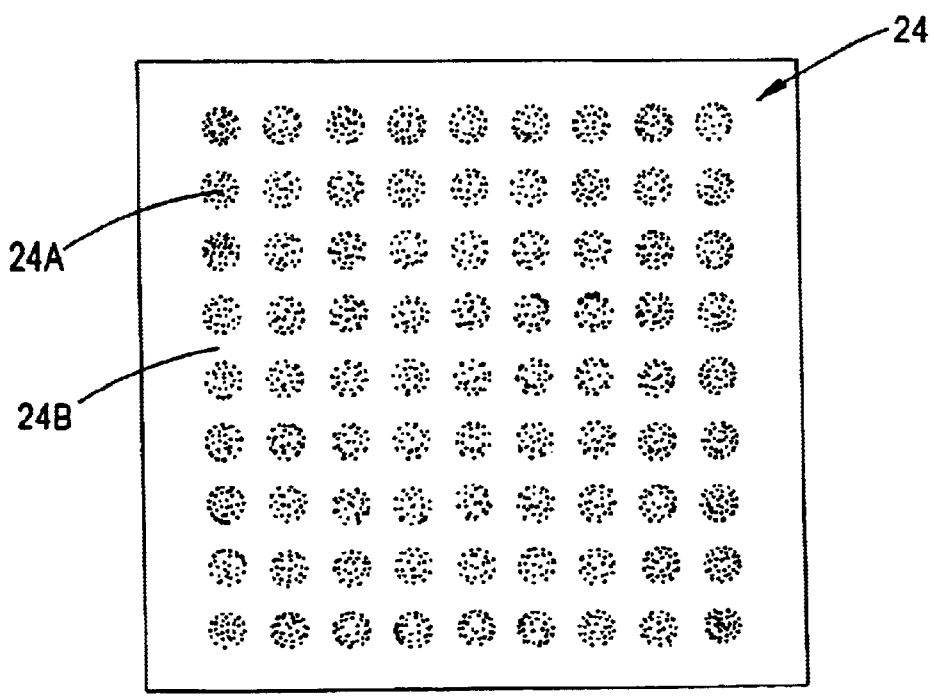
FIG. 4 depicts a top view of a flux pattern to be printed on the semiconductor chip of FIG. 3 by a jet printing head, in accordance with an embodiment of the present invention.

FIG. 4 depicts a flux pattern 24 printed by a jet printing head, in accordance with the present invention. The flux pattern 24 comprises a flux portion 24A and a blank portion 24B. The flux pattern 24 is determined by processing the configuration data converted to the binary data format and stored in the hard disk. The flux pattern 24 is substantially identical to the arrangement pattern of flip-chip bumps 12, which means the flux portion 24A overlaps the flip-chip bumps 12 when the flux pattern 24 is jet printed on the semiconductor chip 10. Accordingly, no flux is deposited on the surface of the semiconductor chip 10 between flip-chip bumps.

Figure 5:
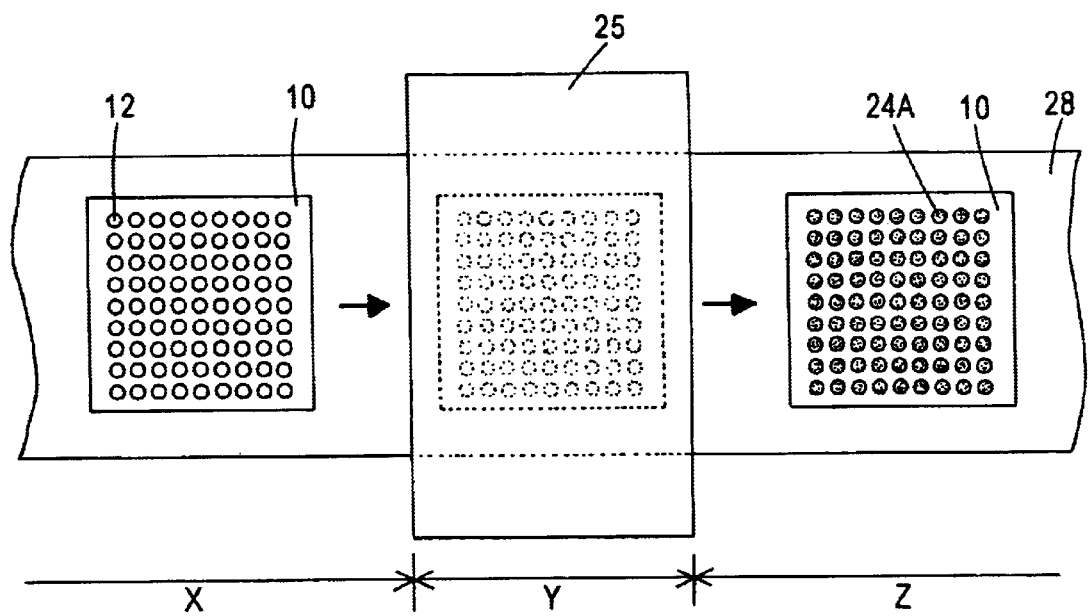
FIG. 5 depicts a portion of a flux depositing apparatus comprising a conveyance plate and a jet printing head, in which the semiconductor chip of FIG. 3 is transported from a pre-deposition area X to a flux deposition area Y for printing the flux pattern of FIG. 4, and then further transported to a post-deposition area Z upon completion of printing the flux pattern, in accordance with an embodiment of the present invention.
Figure 6:
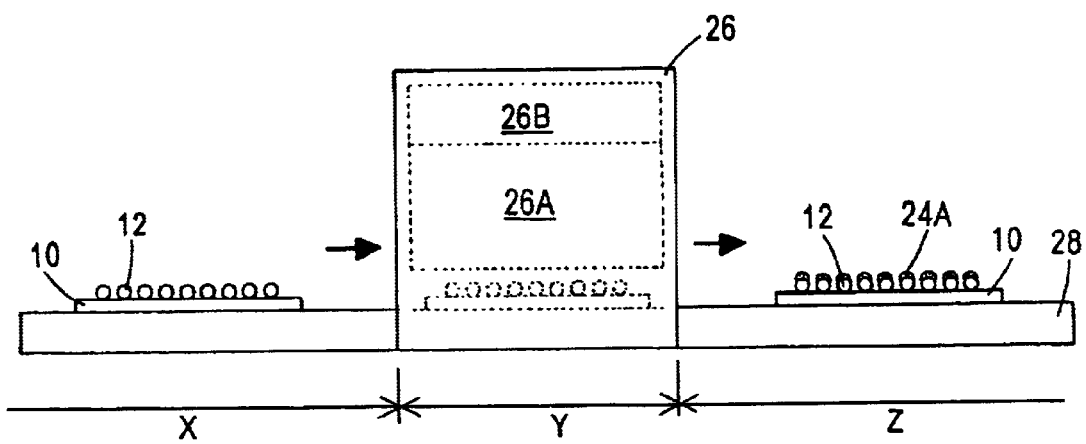
FIG. 6 depicts a side view of the portion of the flux depositing apparatus of FIG. 5.

FIG. 5 depicts a top view of a portion of a flux deposition apparatus and FIG. 6 depicts a side view of the portion of the flux deposition apparatus in FIG. 3, in accordance with an exemplary embodiment of the present invention. The flux deposition apparatus comprises a jet printing head 26 and a conveying belt 28. The semiconductor chip 10 has a plurality of flip-chip bumps 12 arranged on its surface. The conveying belt 28 transports the chip 10 from a pre-deposition area X to a flux deposition area Y to align the chip 10 with the jet printing head 26. The jet printing head 26 comprises a printing portion 26A and a controller portion 26B, which includes data storage. Alternatively, the controller portion 26B can be located separately from the printing portion 26A and connected to it by cable. The printing portion 26A prints a flux pattern 24A based on the arrangement pattern of flip-chip bumps 12 stored in the data storage 26B, which is substantially identical to the arrangement pattern of the flip-chip bumps 12. Upon the completion of printing the flux pattern, the conveying belt 28 transports the semiconductor chip 10 from the flux deposition area Y to a post-deposition area Z. In accordance with the present invention, a plurality of semiconductor chips are successively transported from the pre-deposition area X to the flux deposition area Y to align each semiconductor chip with the jet printing head 26, and, upon the completion of printing the flux pattern 24A, the semiconductor chips are successively transported from the flux deposition area Y to the post-deposition area Z.

Instead of a conveying belt 28, the chips 10 may be located in a conventional boat normally used in chip processing. The boat can be carried on rails to pass underneath the flux deposition area Y.

Figure 7:
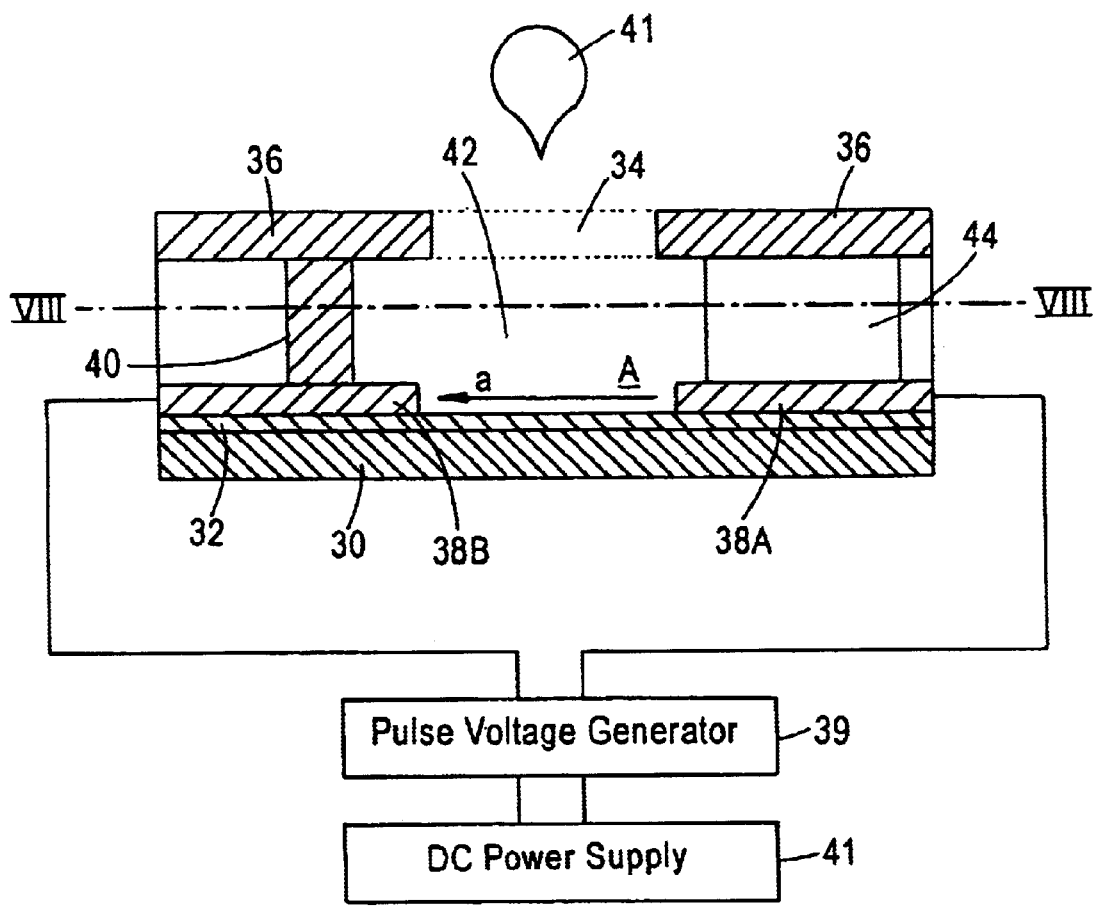
FIG. 7 depicts a cross-sectional view of a portion of the jet printing head in accordance with an embodiment of the present invention.
Figure 8:
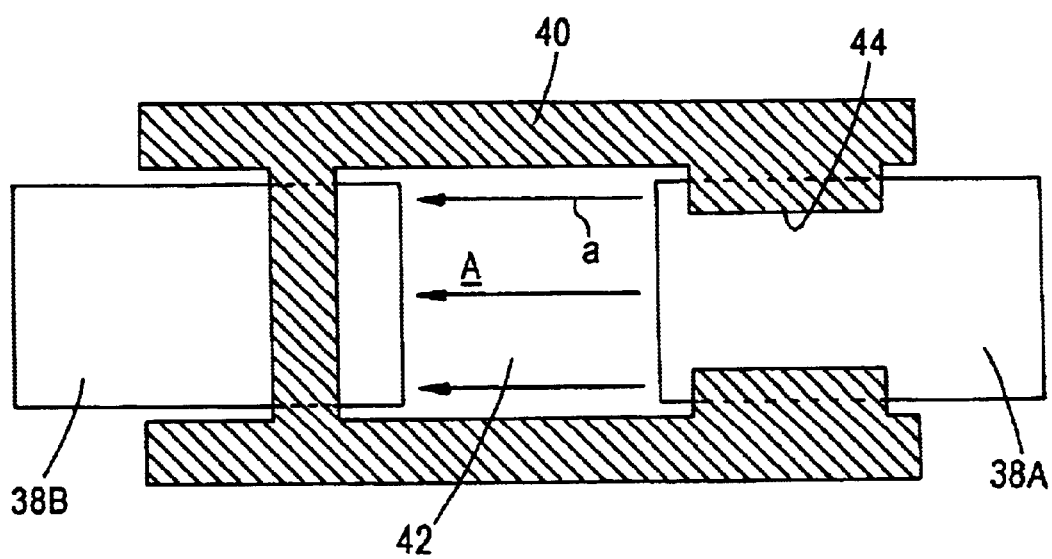
FIG. 8 depicts a top view of the portion of the jet printing bead of FIG. 7.

FIG. 7 depicts a fragmentary cross-sectional view of a portion of a jet printing head, and FIG. 8 is a cross-sectional view taken along line VII—VII of FIG. 7. The jet printing head includes a base plate 30 on which a heat-insulating layer 32 is laminated. A nozzle plate 36 having a plurality of discharge holes 34 (only one being shown) is disposed in parallel spaced relation to the base plate 30. A plurality of pairs of opposite electrodes 38A, 38B (only one pair being shown) arranged in a predetermined pattern or matrix are disposed on an upper surface of the heat-insulating layer 32. Each of the individual pair of electrode 38A, 38B is located at a position corresponding to the position of one of the discharged holes 34. Each of the electrode pairs 38A, 38B comprises a signal electrode 38A and a common electrode 38B confronting one another with a predetermined space or gap therebetween. A partition member 40 made of an electrically insulating material is disposed between the heat-insulating layer 32 and the nozzle plate 36 so as to isolate the individual discharge holes 34 from one another against interference. The heat insulating layer 32, partition member 40 and nozzle plate 36 jointly define a plurality of pressure chambers 42 (only one being shown). Each pressure chamber 42 communicates with a flux passage 44, so that flux is introduced into the pressure chamber 42 though the flux passage 36.

A pulse voltage generator 39 is coupled to the electrodes 38A, 38B by means of which a voltage from a DC power supply 41 is selectively applied to the electrode 38A. Reference character "a" designates electric line of force, passing through a portion of the flux contained between the signal electrode 38A and common electrode 38B. Reference character "A" designates a current flow passage between the signal electrode 38A and common electrode 38B. With this arrangement, when a current flows along the electric line of force "a", the flux contained in the current flow channel "A" is caused to evolve heat and become vaporized. The vaporized flux raises the pressure in the pressure chamber 42, forcing a droplet 46 of flux from the discharge hole 34 of the jet printing head.

Accordingly, the present invention enables the selective deposition of flux on individual flip-chip bumps by jet printing a flux pattern that is substantially identical to the arrangement pattern of the flip-chip bumps. Since no flux is deposited on the chip surface between the flip-chip bumps, the present invention reduces problems caused by flux residue, i.e., the device's functional failure during long term use due, and risk C4 fatigue life and C4 reliability during production on-off cycles. Also, the present invention reduces manufacturing cost and time because no subsequent processes for cleaning flux residue are not required and flux is not wasted on the chip surface.

Although the present invention has been described and illustrated in detail it is to be clearly understood that the same is by way of illustration and example only and is not to be taken by way of limitation, the spirit and scope of the present invention being limited only by the terms of the appended claims.

What is claimed is:

1. An apparatus for depositing flux on a semiconductor chip, the apparatus comprising:

a support for positioning the semiconductor chip at a predetermined location for depositing flux, the semiconductor chip having a plurality of flip-chip bumps arranged on its surface; and a jet printing head for printing a flux pattern, on the flip-chip bumps, the flux pattern substantially identical to an arrangement pattern of the plurality of flip-chip bumps on the semiconductor chip, such that the flux is deposited substantially only on the flip-chip bumps further comprising data storage storing an arrangement pattern of the flip-chip bumps on the semiconductor chip.

2. The apparatus of claim 1, wherein the arrangement pattern is stored in computer-recognizable data in the data storage.

3. The apparatus of claim 2, wherein the jet printing head prints the flux pattern based on the computer-recognizable data stored in the data storage.

4. The apparatus of claim 1, wherein the jet printing head is capable of printing a plurality of flux patterns corresponding to a plurality of arrangement patterns of flip-chip bumps of semiconductor chips by storing the plurality of arrangement patterns in the data storage.

5. The apparatus of claim 1, wherein the support is a conveying plate transporting the semiconductor chip to the predetermined location for printing the pattern on the flip-chip bumps.

6. The apparatus of claim 5, wherein the conveying plate transports a plurality of semiconductor chips successively arranged thereon to the predetermined location for printing the pattern.

* * * * *